(12) United States Patent
Xiang et al.

(10) Patent No.: US 7,138,302 B2
(45) Date of Patent: Nov. 21, 2006

(54) METHOD OF FABRICATING AN INTEGRATED CIRCUIT CHANNEL REGION

(75) Inventors: Qi Xiang, San Jose, CA (US); James N. Pan, Fishkill, NY (US); Jung-Suk Goo, Stanford, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 26 days.

(21) Appl. No.: 10/755,763

(22) Filed: Jan. 12, 2004

(65) Prior Publication Data

US 2005/0153486 A1 Jul. 14, 2005

(51) Int. Cl.
*H01L 21/335* (2006.01)
*H01L 21/84* (2006.01)
*H01L 21/338* (2006.01)
*H01L 21/8249* (2006.01)
*H01L 27/01* (2006.01)

(52) U.S. Cl. ............... 438/142; 438/156; 438/157; 438/182; 438/212; 438/478; 257/347

(58) Field of Classification Search ............ None
See application file for complete search history.

(56) References Cited

U.S. PATENT DOCUMENTS

| 6,197,641 | B1 | 3/2001 | Hergenrother et al. |
| 6,645,797 | B1 | 11/2003 | Buynoski et al. |
| 6,806,534 | B1 * | 10/2004 | Dokumaci et al. ......... 257/330 |
| 6,835,618 | B1 * | 12/2004 | Dakshina-Murthy et al. ............ 438/256 |
| 6,855,583 | B1 * | 2/2005 | Krivokapic et al. ........ 438/157 |
| 2003/0201458 | A1 | 10/2003 | Clark et al. |
| 2003/0227036 | A1 | 12/2003 | Sugiyama et al. |
| 2004/0031979 | A1 * | 2/2004 | Lochtefeld et al. ......... 257/233 |
| 2004/0169239 | A1 | 9/2004 | Rim |
| 2005/0048743 | A1 * | 3/2005 | Djomehri et al. ........... 438/479 |
| 2005/0205859 | A1 * | 9/2005 | Currie et al. ............... 257/19 |

FOREIGN PATENT DOCUMENTS

WO WO 03/105189 A2 12/2003
WO WO 2003/105189 A2 12/2003

OTHER PUBLICATIONS

International Search Report; International Application No. PCT/US2004/043106; mailed Apr. 12, 2005; 4 pages.
Written Opinion of the International Searching Authority for International Application No. PCT/US2004/043106; 8 pages.
Yang, Fu-Liang, et al.; Strained FIP-SOI (FinFET/FD/PD-SOI) for Sub-65 nm CMOS Scaling; 2003 Symposium on VLSI Technology Digest of Technical Papers; p. 137.

(Continued)

*Primary Examiner*—Carl Whitehead, Jr.
*Assistant Examiner*—James M. Mitchell
(74) *Attorney, Agent, or Firm*—Foley & Lardner LLP

(57) ABSTRACT

An exemplary embodiment relates to a method of FinFET channel structure formation. The method can include providing a compound semiconductor layer above an insulating layer, providing a trench in the compound semiconductor layer, and providing a strained semiconductor layer above the compound semiconductor layer and within the trench. The method can also include removing the strained semiconductor layer from above the compound semiconductor layer, thereby leaving the strained semiconductor layer within the trench and removing the compound semiconductor layer to leave the strained semiconductor layer and form the fin-shaped channel region.

20 Claims, 12 Drawing Sheets

OTHER PUBLICATIONS

Yin, Haizhou, et al.; Fully-depleted Strained-Si on Insulator NMOSFETs without Relaxed SiGe Buffers; © 2003 IEEE; pp. 53-56.

International Preliminary Report on Patentability for PCT/US2004/043106, date of mailing May 18, 2006, 7 pages.

Response to International Preliminary Examining Authority enclosing Amended Set of Claims or PCT/US2004/043106, date of mailing Apr. 25, 2006, 5 pages.

International Search Report for PCT/US2004/043106, date of mailing Apr. 12, 2005, 3 pages.

Written Opinion of the International Searching Authority for PCT/US2004/043106, date of mailing Apr. 12, 2005, 8 pages.

Haizhou et al., "Fully-depleted Strained-Si on Insulator NMOSPFETSs Without Relaxed SiGe Buffers", International Electron Devices Meeting 2003., IEDM, Technical Digest, Washington, DC, Dec. 8-10, 2003, New York, BY: IEEE, US, Dec. 8, 2003, pp. 53-56, XPO10683957 ISBM: 0-7803-7872-5.

Yang, et al., "Strained FIP-SOI (FINFET/FD/PD-SOI) for Sub-65 NM CMOS Scaling", 2003 Symposium of VLSI Technology, Digest of Technical Papers, Kyoto, Jpan, Jun. 10-12, 2003, Symposium on VLSI Technology, New York, BY: IEEE, US, Jun. 10, 2003, pp. 137-138, XP001211724, ISBN: 4-89114-033-X.

* cited by examiner

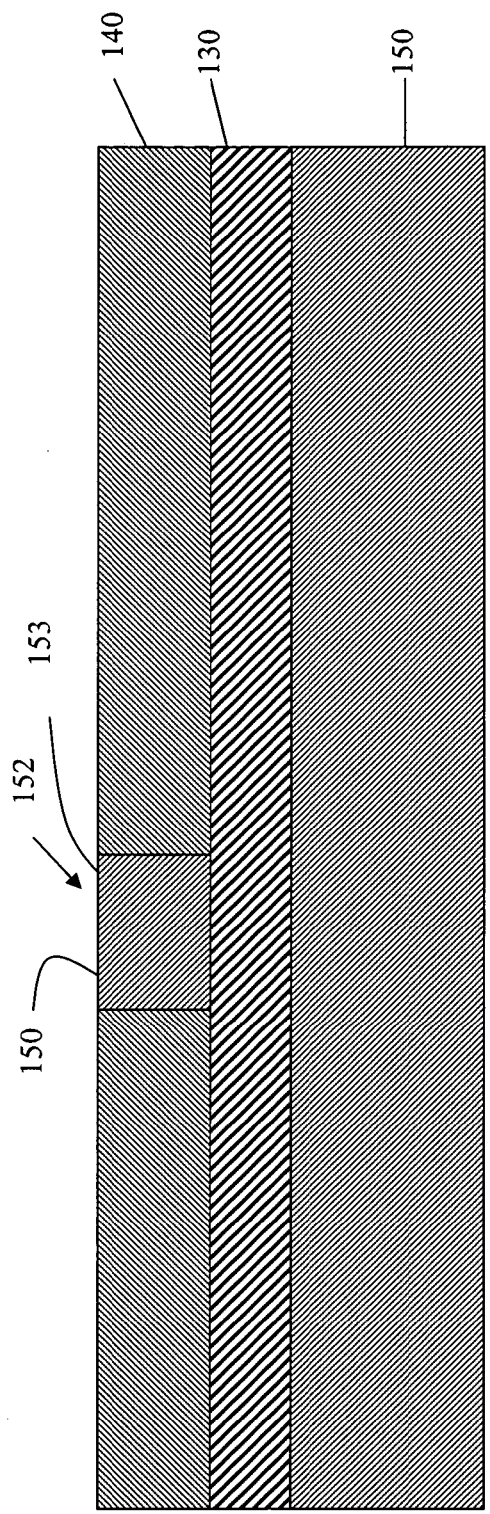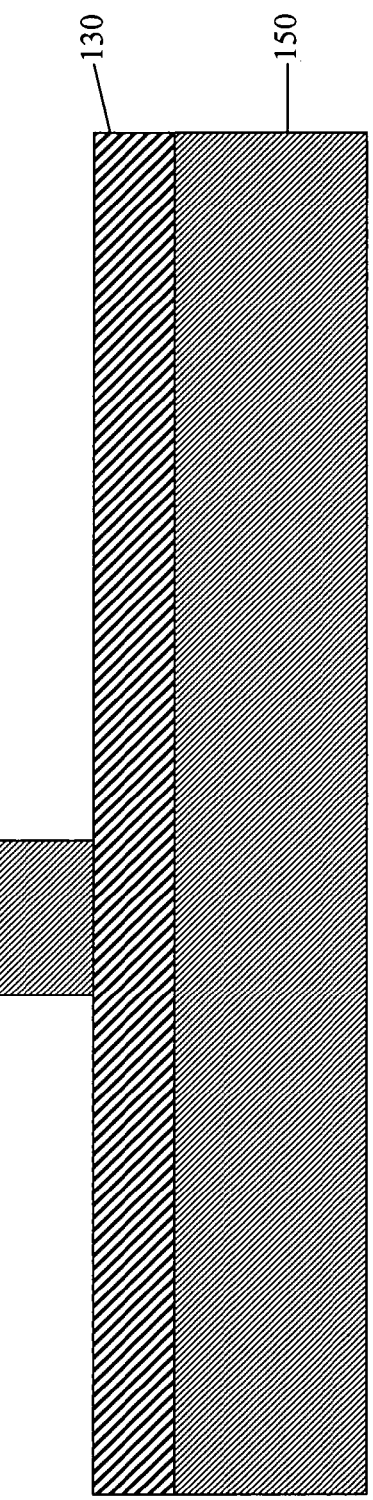

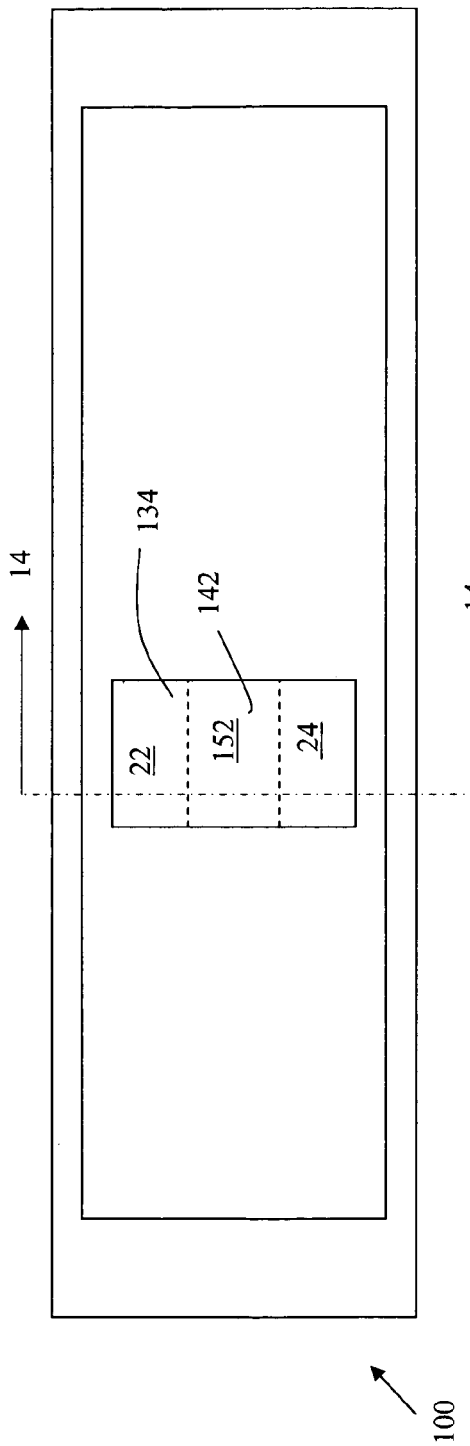
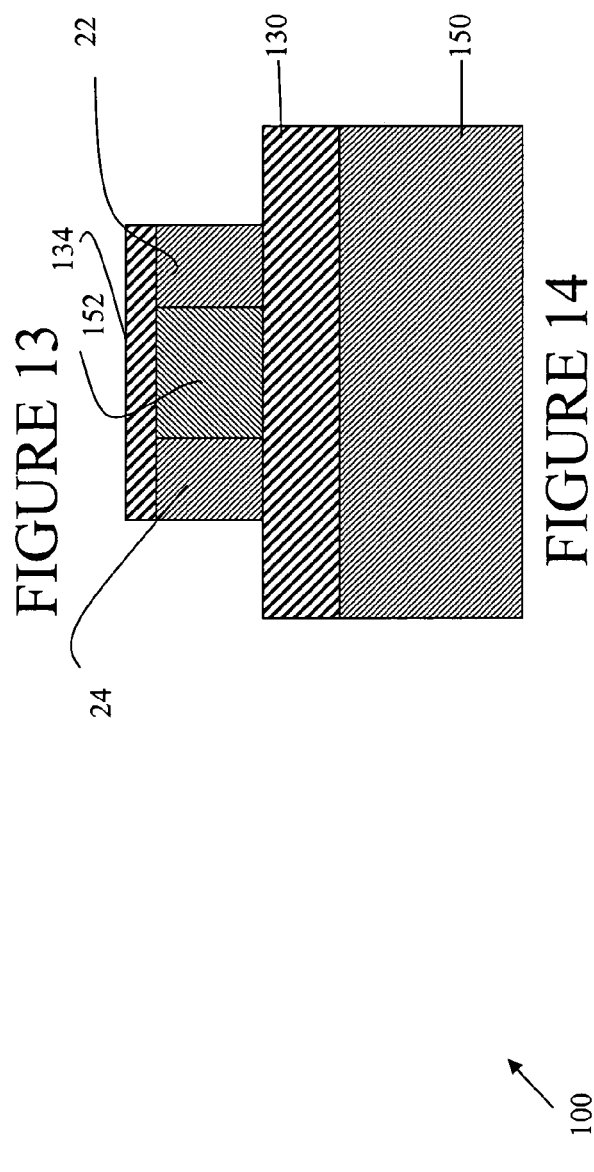
FIGURE 13
FIGURE 14

METHOD OF FABRICATING AN INTEGRATED CIRCUIT CHANNEL REGION

CROSS REFERENCE TO RELATED APPLICATIONS

The present application is related to U.S. patent application No. 10/755,811 filed on Jan. 12, 2004 by Goo et al. and entitled "REPLACEMENT GATE FINFET PROCESS"; U.S. patent application Ser. No. 10/237,829, filed on Sep. 9, 2002 by Tabery et al. and entitled "PLANAR FINFET PATTERNING USING AMORPHOUS CARBON"; and U.S. Patent Application No. 60/415,226, filed on Sep. 30, 2002 by Goo et al. and entitled "FINFET HAVING IMPROVED CARRIER MOBILITY AND METHOD OF ITS FORMATION", all of which are assigned to the Assignee of the present application.

FIELD OF THE INVENTION

The present invention relates generally to integrated circuits (ICs) and methods of manufacturing integrated circuits. More particularly, the present invention relates to a method of fabricating integrated circuits having transistors with a fin-shaped channel region or FinFETS.

BACKGROUND OF THE INVENTION

Integrated circuits (ICs), such as ultra-large-scale integrated (ULSI) circuits, can include as many as one million transistors or more. The ULSI circuit can include complementary metal oxide semiconductor (CMOS) field effect transistors (FETS). Such transistors can include semiconductor gates disposed above a channel region and between source and drain regions. The source and drain regions are typically heavily doped with a P-type dopant (e.g., boron) or an N-type dopant (e.g., phosphorous).

As transistors become smaller, it is desirous to increase the charge carrier mobility in the channel region. Increasing charge carrier mobility increases the switching speed of the transistor. Channel regions formed from materials other than silicon have been proposed to increase charge carrier mobility. For example, conventional thin film transistors which typically utilize polysilicon channel regions have been formed on a silicon germanium (Si—Ge) epitaxial layer above a glass (e.g., $SiO_2$) substrate. The Si—Ge epitaxial layer can be formed by a technique in which a semiconductor thin film, such as an amorphous silicon hydride (a-Si:H), an amorphous germanium hydride (a-Ge:H), or the like is melted and crystallized utilizing irradiation of pulse laser beams.

In a bulk type device, such as a metal oxide semiconductor field effect transistor (MOSFET), the use of Si—Ge materials can be used to increase charge carrier mobility, especially for hole-type carriers. A tensile strained silicon channel region, such as a silicon channel containing germanium, can have carrier mobility 2-5 times greater than a conventional Si channel region due to reduced carrier scattering and due to the reduced mass of holes in the germanium-containing material. According to conventional Si—Ge formation techniques for bulk-type devices, a dopant implant molecular beam epitaxy (MBE) technique forms a Si—Ge epitaxial layer. However, the MBE technique requires very complicated and expensive equipment, and is not feasible for mass production of ICs.

Double gate transistors, such as vertical double gate silicon-on-insulator (SOI) transistors or FinFETS, have significant advantages related to high drive current and high immunity to short channel effects. An article by Huang, et al. entitled "Sub-50 nm FinFET: PMOS" (1999 IEDM) discusses a silicon transistor in which the active layer is surrounded by a gate on two sides. However, double gate structures can be difficult to manufacture using conventional IC fabrication tools and techniques. Further, patterning can be difficult because of the topography associated with a silicon fin. At small critical dimensions, patterning may be impossible.

By way of example, a fin structure can be located over a layer of silicon dioxide, thereby achieving an SOI structure. Conventional FinFET SOI devices have been found to have a number of advantages over devices formed using semiconductor substrate construction, including better isolation between devices, reduced leakage current, reduced latch-up between CMOS elements, reduced chip capacitance, and reduction or elimination of short channel coupling between source and drain regions. While the conventional FinFET SOI devices provide advantages over MOSFETs formed on bulk semiconductor substrates due to its SOI construction, some fundamental characteristics of the FinFET, such as carrier mobility, are the same as those of other MOSFETs because the FinFET source, drain and channel regions are typically made from conventional bulk MOSFET semiconductor materials (e.g., silicon).

The fin structure of FinFET SOI devices can be located below several different layers, including a photoresist layer, a bottom anti-reflective coating (BARC) layer, and a polysilicon layer. Various problems can exist with such a configuration. The photoresist layer may be thinner over the fin structure. In contrast, the polysilicon layer may be very thick at the edge of the fin structure. The BARC may be thick at the edge of the fin structure. Such a configuration leads to large over-etch requirements for the BARC layer and the polysilicon layer. Such requirements increase the size of the transistor.

When manufacturing FinFET structures, it is desirous to have a fin channel structure with a high aspect ratio. A higher aspect ratio for the fin channel structure allows a larger amount of current to be provided through the same amount of topographical area. Heretofore, fabrication of high aspect ratio FinFETS has not been practicable for large-scale fabrication.

Thus, there is a need for an integrated circuit or electronic device that includes channel regions with higher channel mobility, higher immunity to short channel effects, and higher drive current. Further, there is a need for a method of patterning FinFET devices having small critical dimensions. Even further, there is a need for a method of fabricating strained silicon fin-shaped channels for FinFET devices. Yet further, there is a need for a high aspect ratio FinFET device. Even further still, there is a need for an efficient method of manufacturing a high aspect ratio fin structure. Further still, there is a need for a FinFET device with a strained semiconductor fin-shaped channel region. Yet even further, there is a need for a process of fabricating a FinFET device with a strained semiconductor fin-shaped channel.

SUMMARY OF THE INVENTION

An exemplary embodiment relates to a method of forming a fin-shaped channel region. The method includes providing a compound semiconductor layer above an insulating layer and providing a trench in the compound semiconductor layer. The method also includes providing a strained semiconductor layer above the compound semiconductor layer and within the trench. The trench is associated with the fin-shaped channel region. The method further includes removing the strained semiconductor layer from above the compound semiconductor layer and removing the compound semiconductor layer to leave the strained semiconductor layer and form the fin-shaped channel region. When the strained semiconductor layer is removed, the strained semiconductor layer is left within the trench.

Another exemplary embodiment relates to a method of FinFET channel structure formation. The method includes providing a first layer above an insulating layer above a substrate and providing an aperture in the first layer. The first layer includes silicon and germanium and the aperture extends to the insulating layer. The method also includes providing a strained material within the aperture and removing the first layer to leave the strained material.

Yet another exemplary embodiment relates to a method of fabricating an integrated circuit including a fin-based transistor. The method includes steps of providing an insulative material, providing a strain inducing layer above the insulative material, and providing an aperture in the strain inducing layer. The method further includes forming a strained material in the aperture by selective epitaxial growth, removing at least a portion of the strain inducing layer to thereby leave the strained material as a fin structure and providing a gate structure for the fin structure.

BRIEF DESCRIPTION OF THE DRAWINGS

Exemplary embodiments will hereafter be described with reference to the accompanying drawings, wherein like numerals denote like elements, and:

FIG. 9 is a schematic cross-sectional view representation of the portion of the integrated circuit illustrated in FIG. 8 showing a chemical mechanical polish operation;

FIG. 10 is a schematic cross-sectional view representation of the portion of the integrated circuit illustrated in FIG. 9 showing a selective etching operation;

FIG. 13 is a general schematic planar top view representation of a portion of another integrated circuit fabricated according to the process illustrated in FIG. 12 in accordance with another exemplary embodiment;

FIG. 14 is a schematic cross-sectional view representation of the portion of the integrated circuit illustrated in FIG. 13 taken across line 14—14 in accordance with an exemplary embodiment and showing a masking operation for the process illustrated in FIG. 12;

DETAILED DESCRIPTION OF EXEMPLARY EMBODIMENTS

Figure 1:
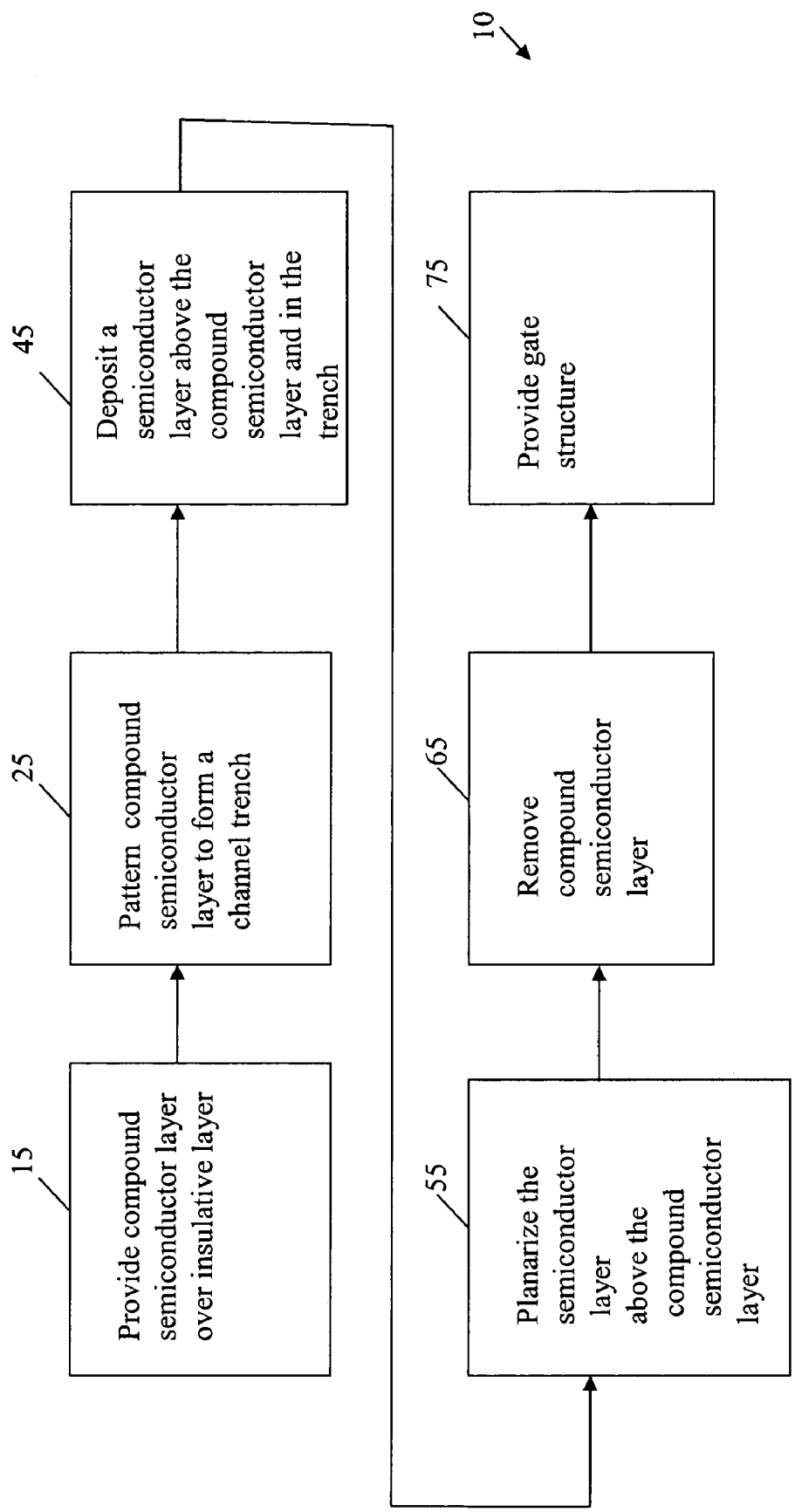
FIG. 1 is a flow diagram depicting exemplary operations in a process for forming a fin-based transistor for an integrated circuit in accordance with an exemplary embodiment.

FIG. 1 is a flow diagram depicting exemplary operations in a method or process 10 of patterning a fin-based transistor or fin field effect transistor (FinFET). The flow diagram illustrates by way of example some operations that may be performed. Additional operations, fewer operations, or combinations of operations may be utilized in various different embodiments. Flow diagram 110 (FIG. 12) illustrates on alternative embodiment in which a masking step is used to protect source and drain locations during etching. Flow diagram (FIG. 15) illustrates another alternative embodiment in which a spacer is utilized to increase the aspect ratio of the fin structure.

In FIG. 1, a wafer including a compound semiconductor layer over an insulative layer is provided in a step 15. The wafer can be purchased or manufactured using SIMOX (oxygen implementation into silicon and annealing or wafer bonding). In a step 25, the compound semiconductor layer is patterned to form a channel trench. In a step 45, a semiconductor layer is formed above the compound semiconductor and in the trench. The trench in the compound semiconductor layer preferably has a bottom which reaches a top surface of the insulative layer.

In a step 55 of process 10, the semiconductor layer is planarized above the compound semiconductor layer, thereby removing it from a top surface of the compound semiconductor layer and leaving it within the trench. In a step 65, the compound semiconductor layer is removed, thereby leaving a fin-shaped channel structure or region above the insulative layer. In a step 75, a gate structure is provided to complete a fin-based transistor.

Figure 2:
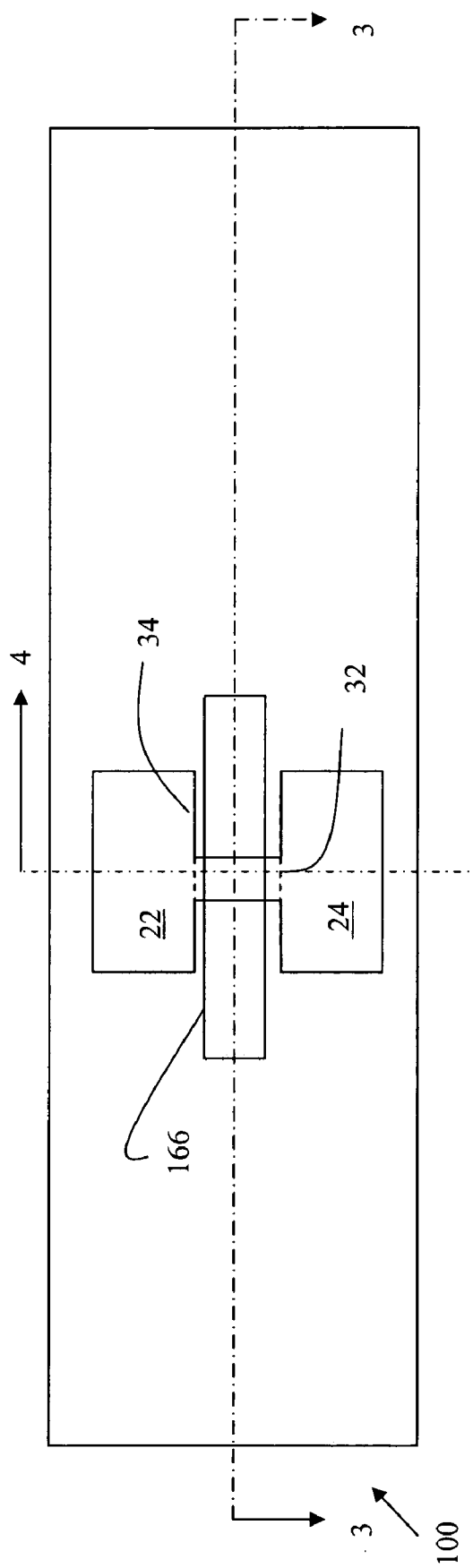
FIG. 2 is a general schematic planar top view representation of a portion of an integrated circuit fabricated according to the process shown in FIG. 1 in accordance with an exemplary embodiment.
Figure 3:
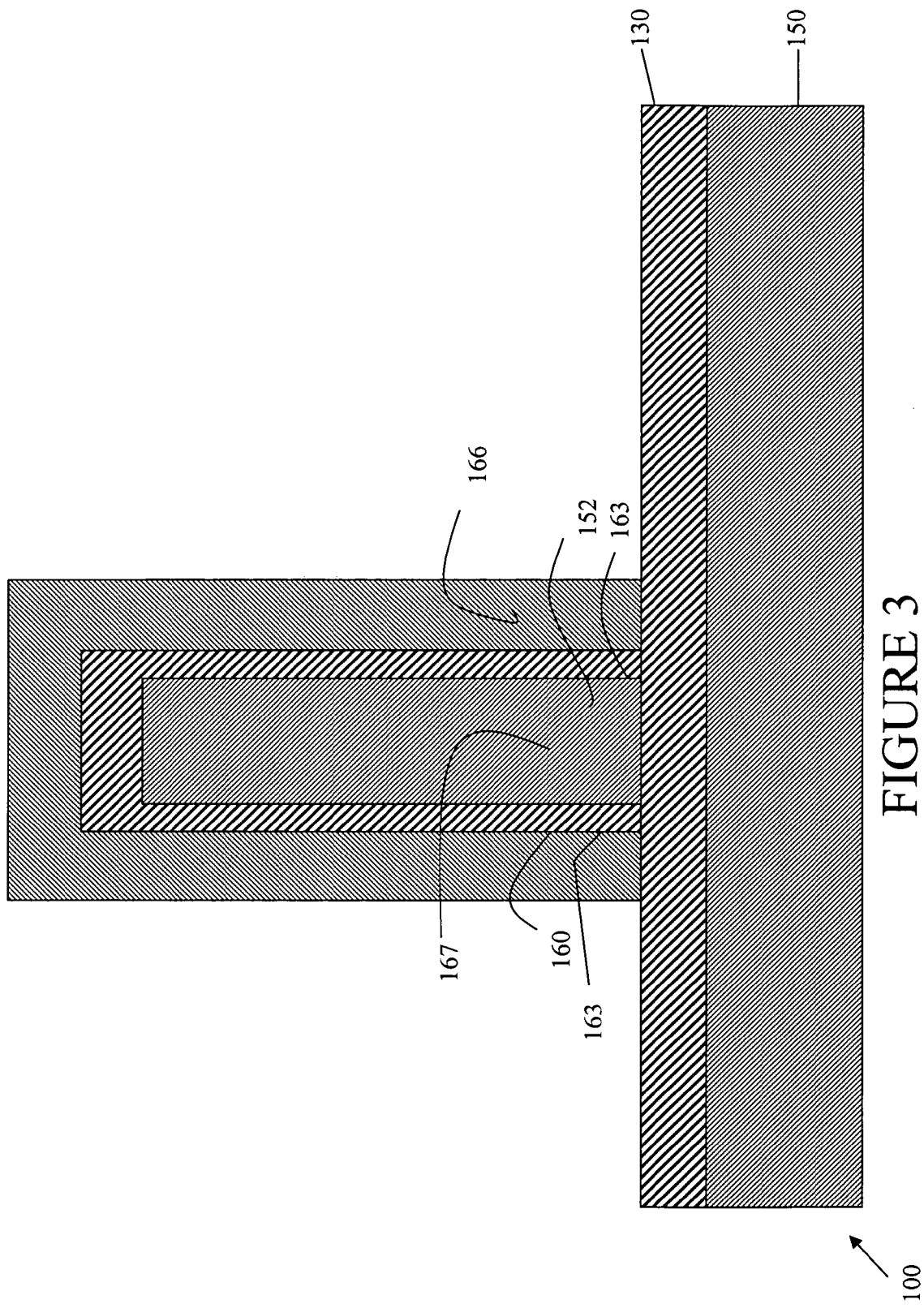
FIG. 3 is a schematic cross-sectional view representation of the portion of the integrated circuit illustrated in FIG. 2 taken across line 3—3 in accordance with an exemplary embodiment.
Figure 4:
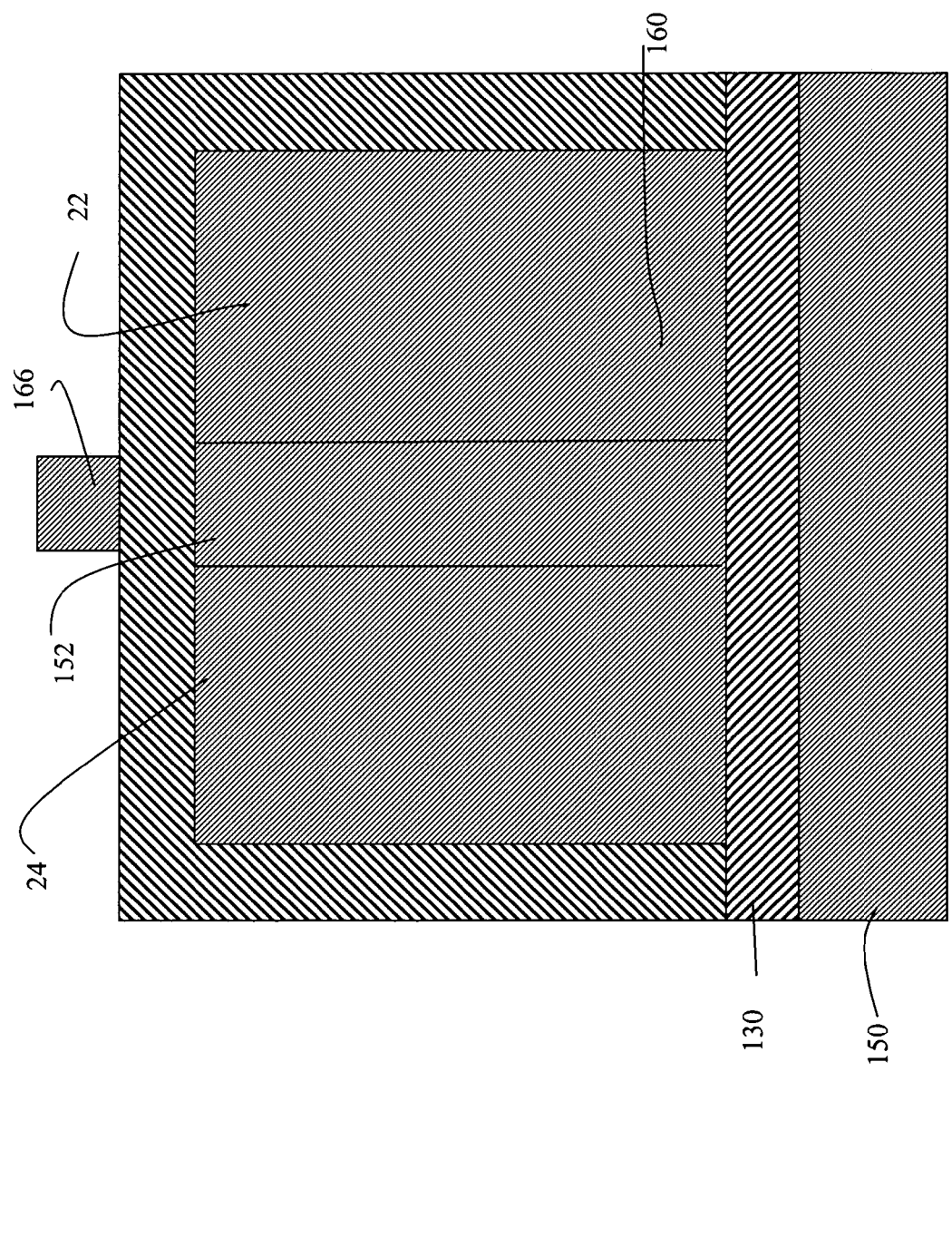
FIG. 4 is a schematic cross-sectional view representation of the portion of the integrated circuit illustrated in FIG. 2 taken across line 4—4 in accordance with an exemplary embodiment.

With reference to FIGS. 2–4, process 10 is utilized to form a portion of an integrated circuit 130 that includes a fin-based transistor or FinFET. FIGS. 2–11, 13, 14 and 16–17 are not drawn to scale. FIGS. 3 and 4 are drawn to show the high aspect ratio associated with fin-shaped channel region 152. However, the remaining figures are not drawn to highlight the high aspect ratio for drawing efficiency. It is noted that FIGS. 1–10 are provided to schematically illustrate and they are not proportional engineering drawings. In FIG. 2, a top view shows a source region 22 and a drain region 24 on opposite sides of a fin-shaped channel region 152. A gate conductor 166 is provided over channel region 152 and a gate dielectric layer 160 which is provided on three sides of channel region 152. As seen in FIG. 3, gate conductor 166 has a U-shaped cross-sectional shape and can surround three sides of fin-shaped channel region 152. Gate conductor 166 can be a metal layer or can be a polysilicon layer (e.g., a doped polysilicon layer). Alternatively, conductor 166 can be provided only adjacent lateral sides 163 of channel region 152.

Dielectric layer 160 can be made of any suitable material for use in gate structures. Dielectric layer 160 can have a U-shaped cross-sectional shape and can be underneath conductor 166. In one embodiment, dielectric layer 160 is thermally grown silicon dioxide. In another embodiment, dielectric layer 160 is a high-K gate dielectric layer, a silicon nitride layer, or another insulator. Layers 160 and gate conductor 166 form a gate structure on lateral sides 163 and above a top surface 167 of fin-shaped channel region 152. Channel region 152 can be subjected to tensile strain through epitaxial growth seeded from a compound semiconductor layer, such as a silicon germanium layer.

In FIG. 4, source region 22 and drain region 24 are covered by dielectric layer 160 on all sides. In another embodiment, layer 160 only covers channel region 152 and is provided only under gate conductor 166. As shown in FIG. 2, gate conductor 166 does not overlap source and drain regions 22 and 24. However, gate conductor 166 can be provided to borders 32 and 34 and even overlap borders 32 and 34 if proper isolation is provided.

Advantageously, fin-shaped channel region 152 has a relatively high aspect ratio. Preferably, region 152 has a height of between approximately 20 nm and 120 nm (e.g., a thickness) and a width of between approximately 5 nm and 20 nm. The fin width is determined by minimum transition gate length (⅓ to ½ of the gate length). In one embodiment, the aspect ratio is between approximately 4 and 6. High aspect ratios associated with region 152 provide a high current transistor through a relatively small area.

Preferably, fin-shaped channel region 152 is a tensile-strained silicon material manufactured in accordance with process 10, process 110, or process 210. Conductor 166 can have a thickness of between approximately 500 Å and 100 Å and gate dielectric layer 160 can have a thickness of between approximately 10 Å and 50 Å . Although shown in FIGS. 2–4, channel region 152 can be utilized with a variety of different types of gate structures. Gate conductors 166 and dielectric layer 160 are not shown in a limiting fashion.

Preferably, the length (from top to bottom in FIG. 2) from an end of source region 22 to an end of drain region 24 is between approximately 0.5 and 1 micron and a width (from left to right of channel region 152 in FIG. 2) of source and drain regions 24 is between approximately 0.2 and 0.4 micron. Source region 22 and drain region 24 include a strained silicon material, a single crystalline material, or a compound semiconductor material. In one embodiment, regions 22 and 24 are made of the same material as region 152. Regions 22 and 24 are preferably doped with N-type or P-type dopants to a concentration of $10^{14}$ to $10^{20}$ dopants per cubic centimeter.

Fin-shaped channel region 152 is provided above an insulative layer 130. Insulative layer 130 is preferably a buried oxide structure, such as, a silicon dioxide layer. In one embodiment, layer 130 has a thickness of between approximately 2000–2000 Å. Layer 130 can be provided above any type of substrate or may be a substrate itself.

In one embodiment, insulative layer 130 is provided above a semiconductor base layer 150 such as a silicon base layer. Layers 130 and 150 can comprise a silicon or semiconductor-on-insulator (SOI) substrate. Alternatively, fin-shaped channel region 152 can be provided above other types of substrates and layers. However, the preferred embodiment provides channel region 152 above an insulating layer such as a buried oxide layer (BOX) above a silicon substrate.

The transistor associated with regions 22 and 24 can have a barbell shape having large pad regions for drain region 22 and source region 24. Alternatively, the transistor can be simply bar shaped. The orientation shown in FIG. 2 is not disclosed in the limiting fashion.

Figure 5:
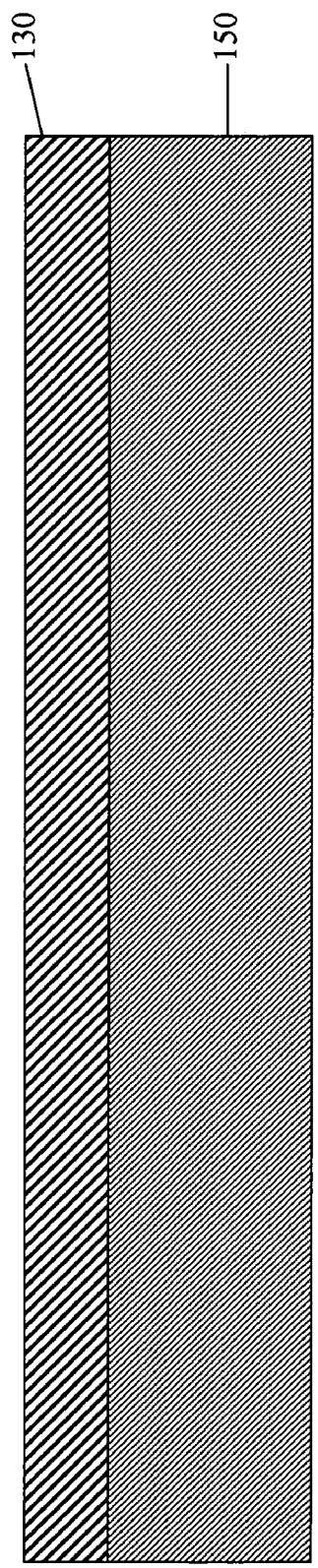
FIG. 5 is a schematic cross-sectional view representation of a portion of the integrated circuit illustrated in FIG. 3 showing an insulating layer above a substrate for use in the process illustrated in FIG. 1.
Figure 6:
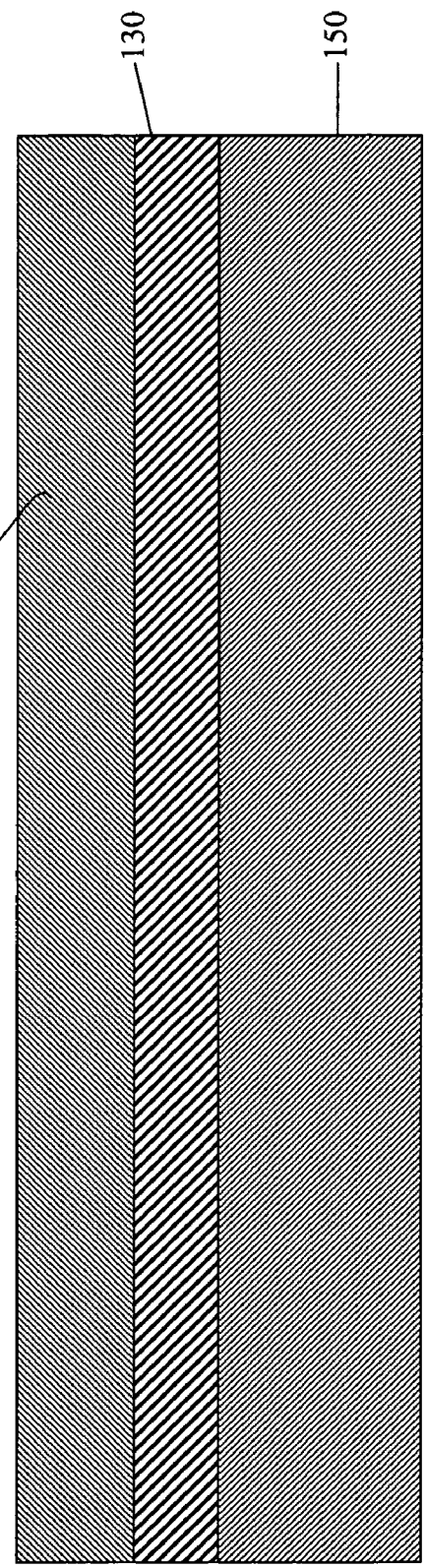
FIG. 6 is a schematic cross-sectional view representation of the portion of the integrated circuit illustrated in FIG. 5 showing a compound semiconductor deposition operation.

In FIG. 5, a substrate is provided including layers 150 and 130. In FIGS. 5–11, the various layers and structures are not drawn according to scale and do not include the large height associated with FIGS. 3–4. In FIG. 6, a layer 140 is provided above layer 130 in accordance with step 15 of process 10 (FIG. 1). In one embodiment, layer 140 can be deposited by a chemical vapor deposition (CVD) above insulative layer 130. Alternatively, layers 130, 140 and 150 can be provided as an SOI substrate in which layer 140 includes silicon germanium.

Layer 140 is preferably a compound semiconductor layer or a strain-inducing semiconductor layer such as a silicon germanium layer. Layer 140 is preferably a composition of $Si_{1-x}Ge_x$, where X is approximately 0.2, and is more generally in the range of 0.1 to 0.3. Various methods can be utilized to produce layers 140, 130, and 150. Layer 140 is preferably provided as a 20 nm to 120 nm thick layer and induces strain in subsequently formed region 152.

Figure 7:
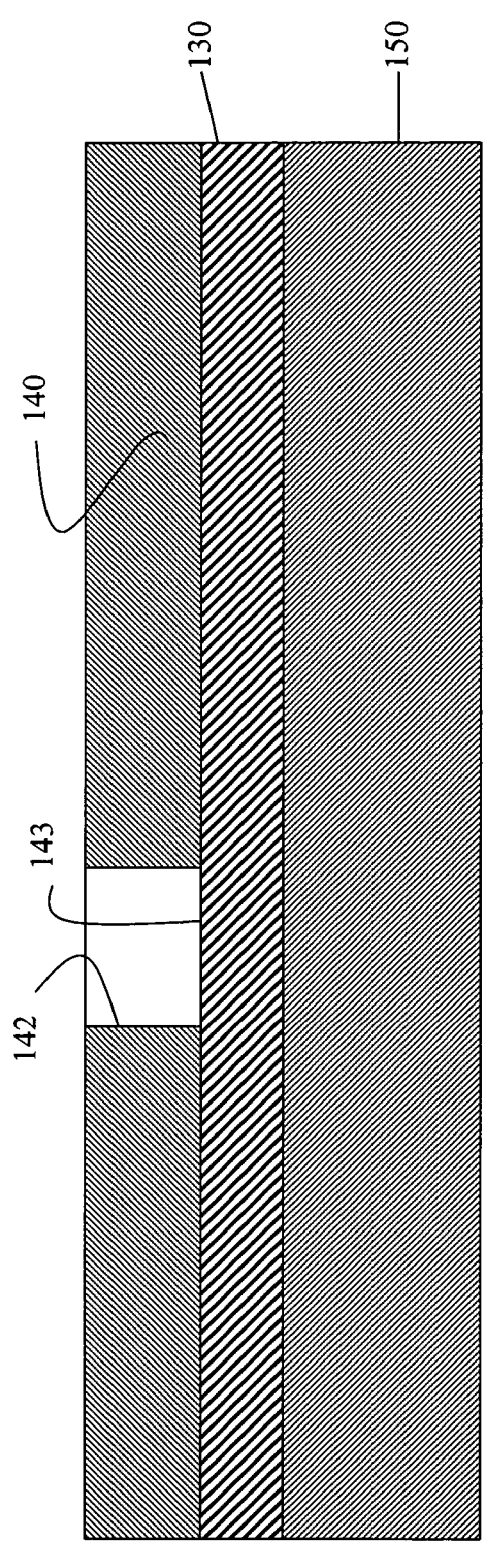
FIG. 7 is a schematic cross-sectional view representation of the portion of the integrated circuit illustrated in FIG. 6 showing a trench formation operation.

In FIG. 7, an aperture or trench 142 is provided in layer 140 in accordance with step 25 of process 10 (FIG. 1). Preferably, trench 142 has a bottom coplanar with a top surface 143 of layer 130. Alternatively, the bottom of trench 142 can terminate before layer 130. Various dimensions can be utilized for trench 142 depending upon design criteria and system parameters for the fin-based transistor.

In one embodiment, trench 142 has a height of 20–120 nm and a width of between approximately 5 and 20 nm. Trench 142 is generally associated with the dimensions of fin-shaped channel region 152. Further, trench 142 can have a length (into and out of the page associated with FIG. 7) of between approximately 1.0 micron to 1.5 micron and 1 micron.

In one embodiment, trench 142 is formed in a photolithographic process. In one such process, antireflective coatings, hard masks, and photoresist materials are utilized to pattern a layer or layers above layer 140. The patterned layer or layers are used to selectively etch layer 140 to create trench 142.

Figure 8:
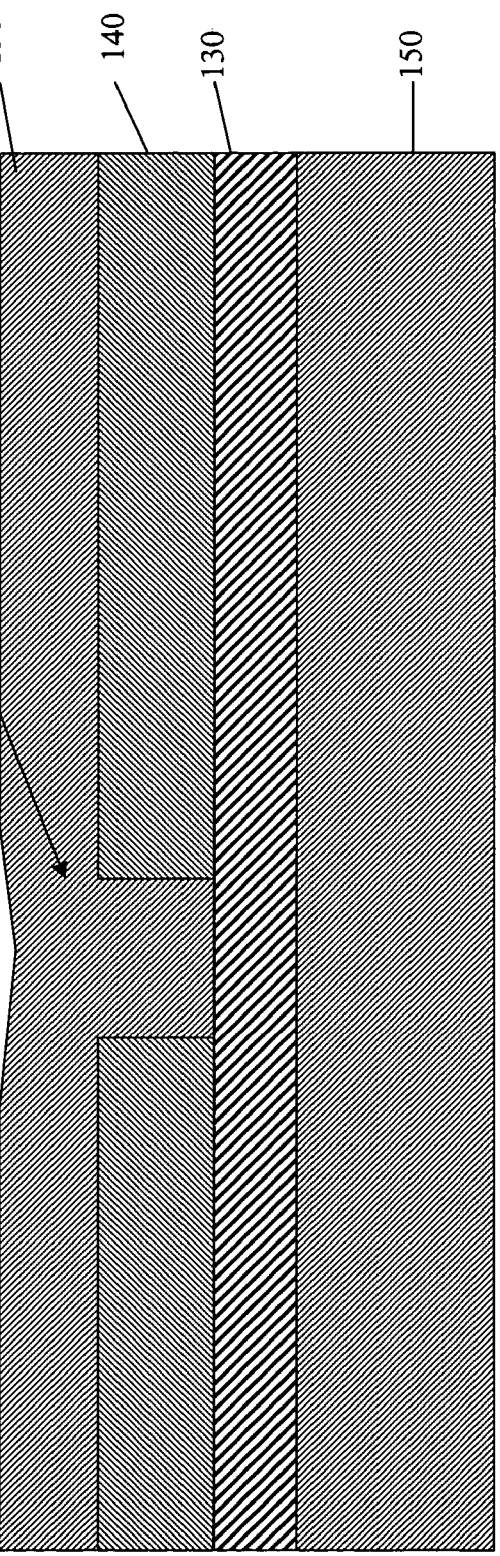
FIG. 8 is a schematic cross-sectional view representation of the portion of the integrated circuit illustrated in FIG. 7 showing an epitaxial growth operation.

In FIG. 8, a layer 144 is formed above layer 140 in step 45 of process 10 (FIG. 1). Preferably, layer 144 fills the entirety of trench 142. Layer 144 is preferably a 40–240 nm thick layer formed by a growth process. In one preferred embodiment, layer 144 is formed by selective silicon epitaxial growth using silane, disilane, and/or dichlorosilane, (using CVD or MBE).

Layer 144 is a strained layer due to the compound semiconductor layer (silicon germanium nature) of layer 140. Sidewalls of trench 142 serve as a seed for crystalline growth of layer 144. The silicon germanium lattice associated with layer 140 results in a more widely spaced interstitial silicon lattice in layer 144, thereby creating a tensile strain in layer 144. As a result, the epitaxial silicon associated with layer 144 is subject to tensile strain.

The application of tensile strain to layer 144 causes 4 of 6 silicon valance bands associated with the silicon lattice to increase in energy and 2 of its valance bands to decrease in energy. As a result of quantum effects, electrons effectively weigh approximately 30% less when passing through the lower energy bands of the strained silicon in layer 144. As a result, carrier mobility is dramatically increased in layer 144, offering the potential increase in mobility of 80% or more for electrons and 20% or more for holes. The increase in mobility has been found to persist for current fields of up to 1.5 megavolts/centimeters. These factors are believed to enable a device speed increase of 35% without further reduction of size, or 25% reduction in power consumption without a reduction in performance.

In FIG. 9, layer 144 is subject to a removal step in a step 55 of process 10 (FIG. 1). In one embodiment, a chemical mechanical polish can be utilized to remove all of layer 144 from directly above layer 130. The nature of the CMP operation allows layer 144 to remain in aperture or trench 142 to form channel region 152. Alternatively, or etching process can be utilized to remove layer 144.

Preferably, the CMP process is stopped so that layer 144 has a height of between approximately 20 and 120 nm from a bottom of trench 142 to a top surface 153.

In FIG. 10, layer 140 is removed in accordance with step 165 of process 10 (FIG. 1). Preferably, layer 140 is removed in a dry etching technique selective to the material of layer 140. In one embodiment, the dry etching technique is selective to silicon germanium with respect to silicon. Layer 140 can be removed by a wet or an isotropic etch. The etching technique is not as selective to layer 144, thereby leaving fin-shaped channel region 152. Alternatively, etching techniques can be utilized to remove layer 140.

Figure 11:
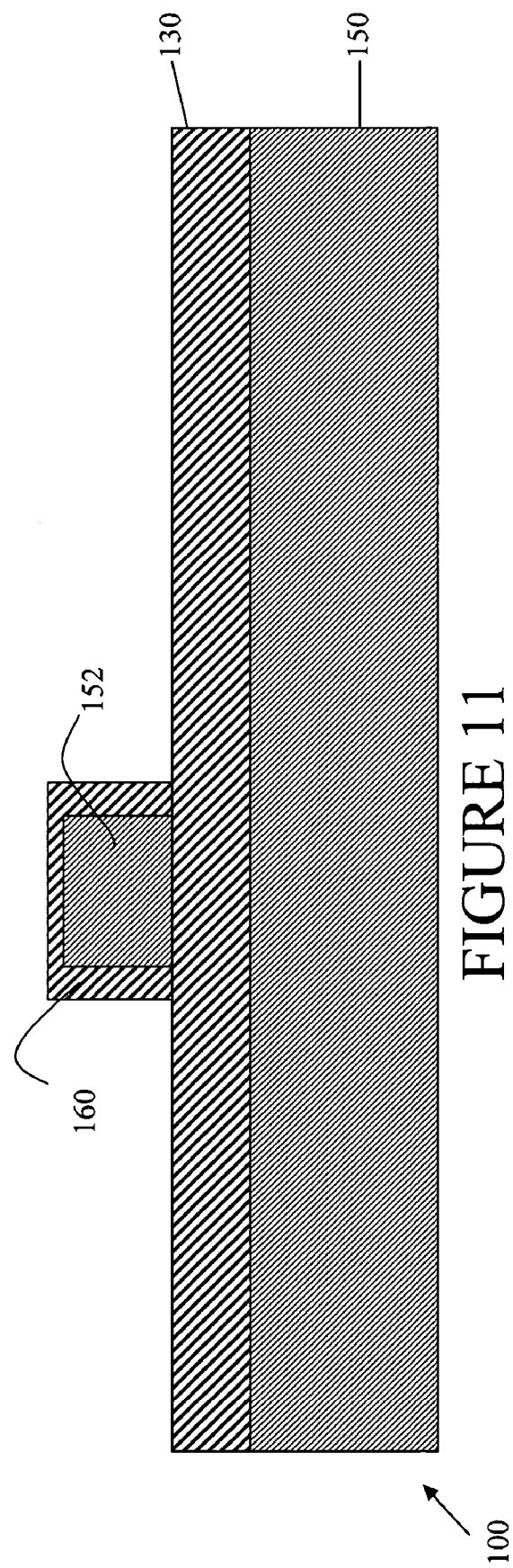
FIG. 11 is a schematic cross-sectional view representation of the portion of the integrated circuit illustrated in FIG. 5 showing a gate oxide formation operation.

In FIG. 11, a gate dielectric layer 160 is formed in accordance with step 175 of process 10 (FIG. 1). Layer 160 can be thermally grown or deposited to a thickness of between approximately 10 and 50 Å on the three exposed sides of channel region 152. In FIGS. 3 and 4, layer 165 is provided to complete the gate structure. Layer 165 can be a 500 to 1000 Å thick polysilicon layer deposited by CVD.

Figure 12:
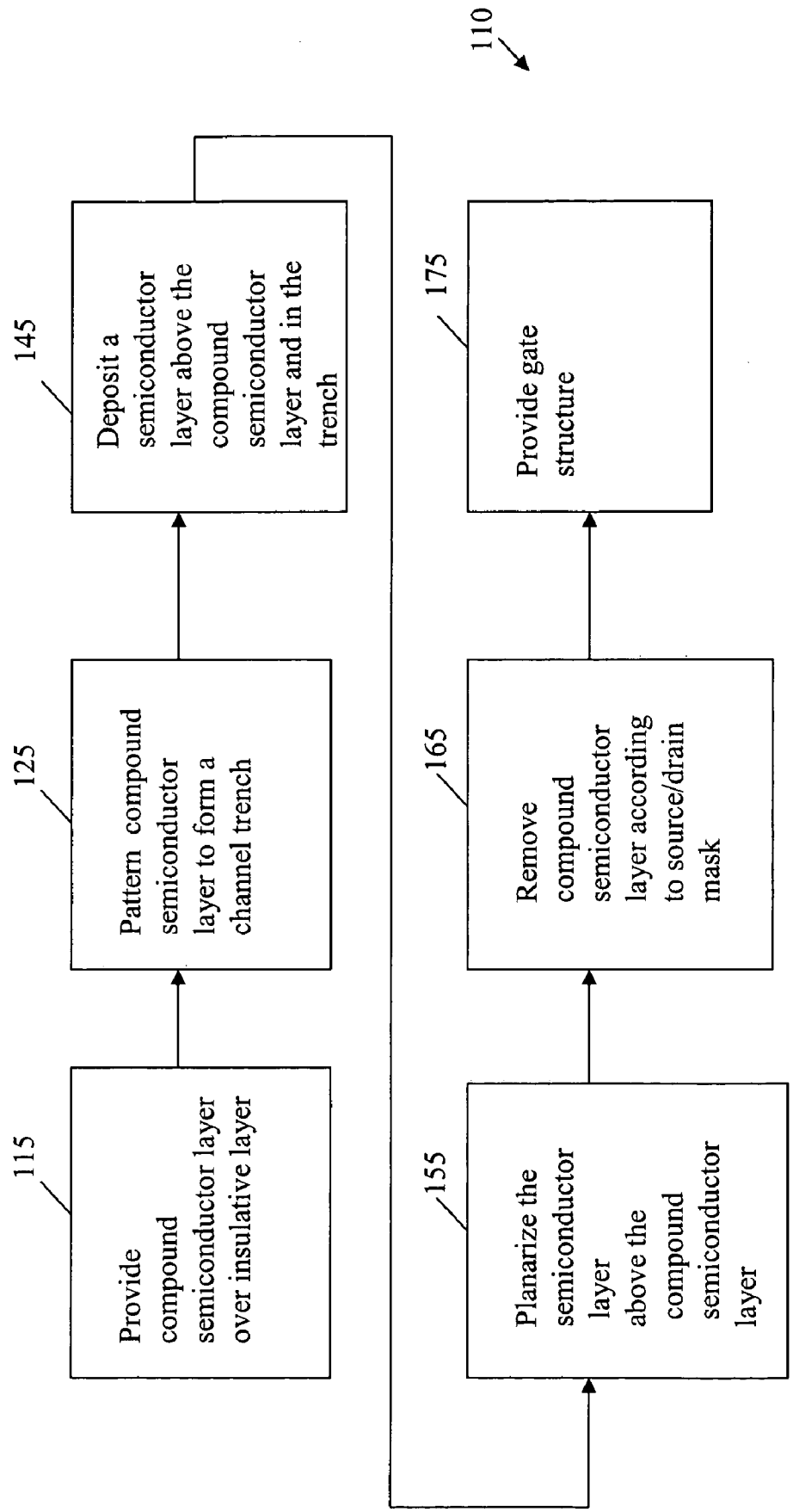
FIG. 12 is a flow diagram depicting exemplary operations in another process for forming a fin-based transistor for an integrated circuit in accordance with an exemplary embodiment.

With reference to FIG. 12, process 110 is similar to process 10 in which steps having the same last two digits are essentially the same. However, process 110 includes a step 165 of removing compound layer 140 in accordance with a source/drain mask. Step 165 can be performed instead of step 65 in process 10 (FIG. 1).

With reference to FIGS. 13 and 14, in step 165 of process 110, a mask 134 protects source and drain regions 22 and 24 during step 165. In one embodiment, source region 22 and drain region 24 are manufactured from layer 140, thereby providing silicon germanium material for maintaining tensile stress on channel region 152. In this manner, mask 134 prevents layer 140 from being removed at the end points (regions 22 and 24 of the fin-shaped transistor). Alternatively, regions 22 and 24 can be material associated with layer 144 which are protected by mask 134. Mask 134 can be a photolithographic mask, a hard mask, or other suitable material. In one embodiment, mask 134 is a silicon dioxide or silicon nitride material.

In FIG. 14, the various layers and structures are not drawn according to scale and do not include the large height associated with FIGS. 3–4. In addition, a bar shaped rather than bar-bell shaped transistor is shown in FIGS. 13–14.

Figure 15:
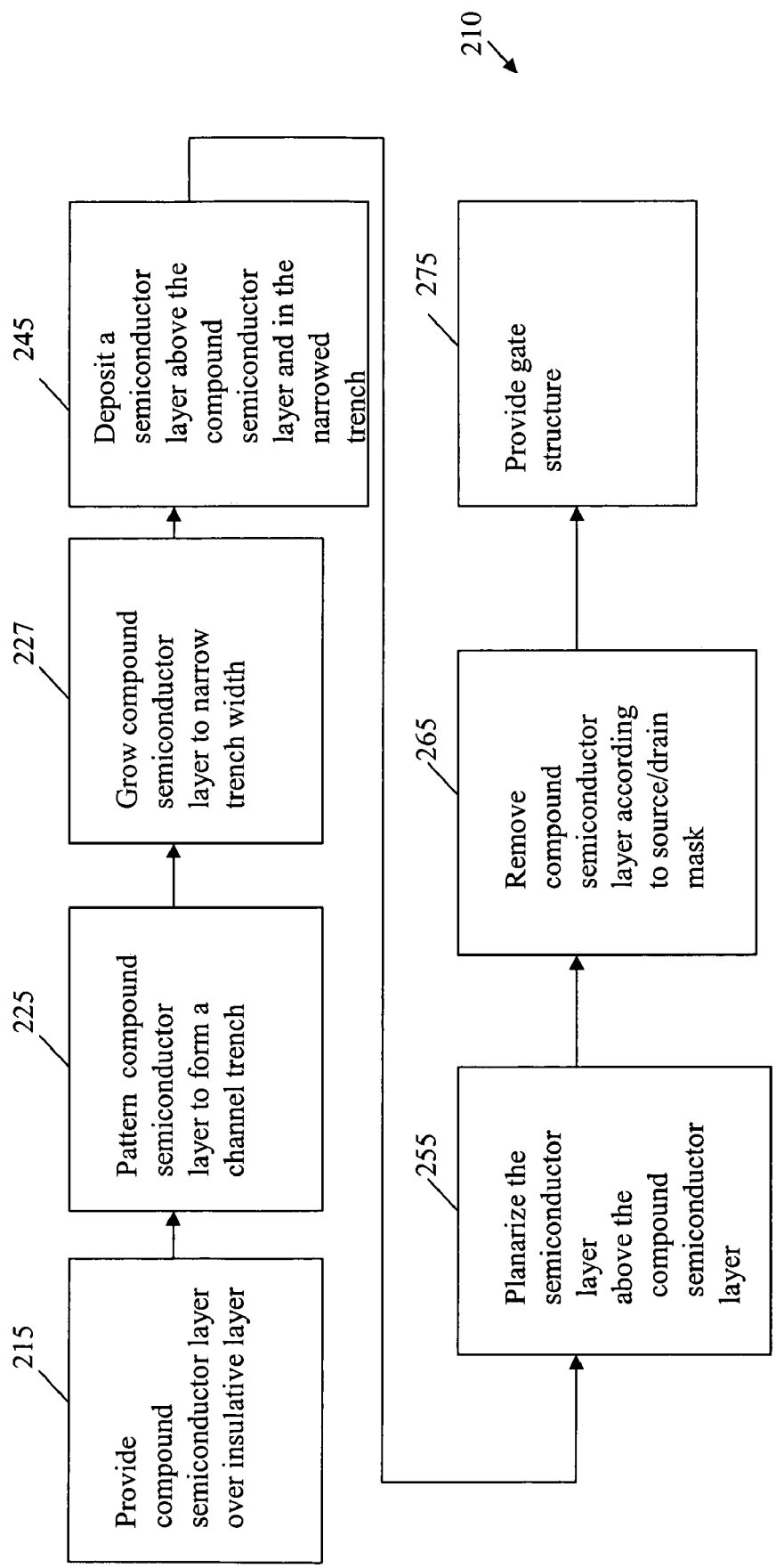
FIG. 15 is a flow diagram depicting exemplary operations in yet another process for forming a fin-based transistor for an integrated circuit in accordance exemplary embodiment.

With reference to FIG. 15, process 210 is similar to processes 10 and 110 in which having the same last two digits are essentially the same. However, process 210 includes a step 227 in which a spacer material is grown within the transformed in step 225 to narrow the width of the trench. Such a step allows a higher aspect ratio for the fin-shaped channel region 152 to be built. Step 227 can be performed after steps 25 and 125 and before steps 45 and 145 in processes 10 and 110, respectively.

The spacer material can be a compound semiconductor layer, and can be the same material as used for layer 140. The spacer material can be selectively grown within trench 142 or grown across a top surface of layer 140 as well as within trench 142 and then selectively removed.

Figure 16:
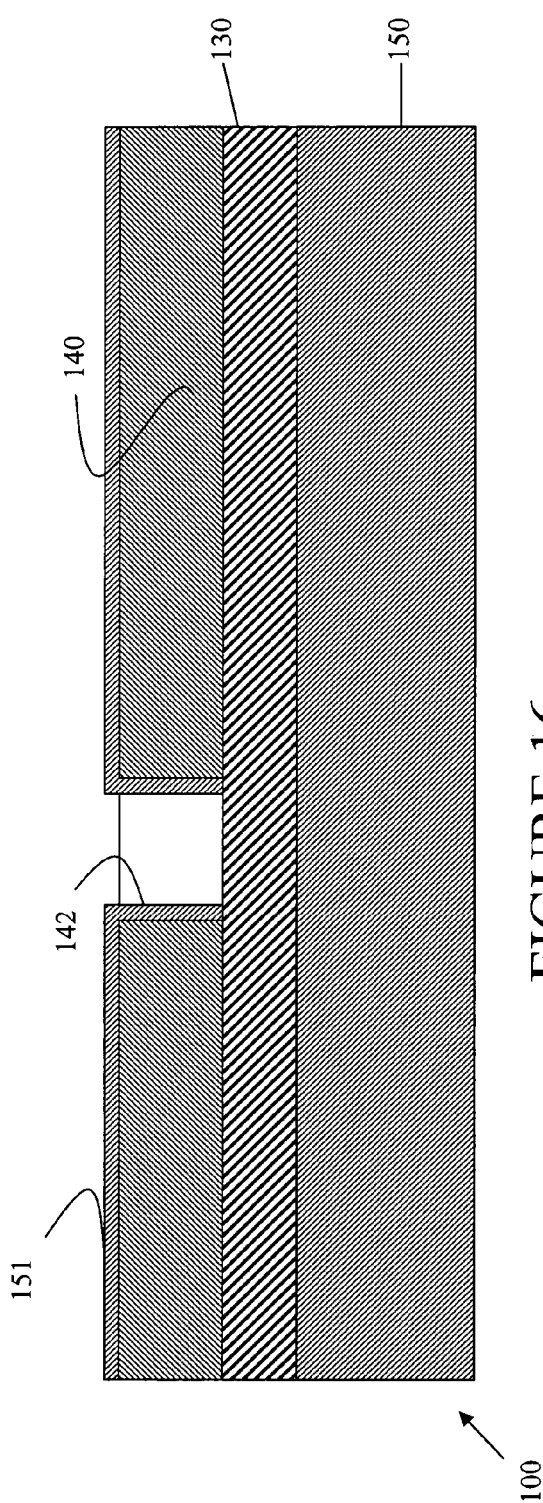
FIG. 16 is a schematic cross-sectional view representation of a portion of the integrated circuit fabricated according to the process shown in FIG. 15 showing a spacer material provision operation.
Figure 17:
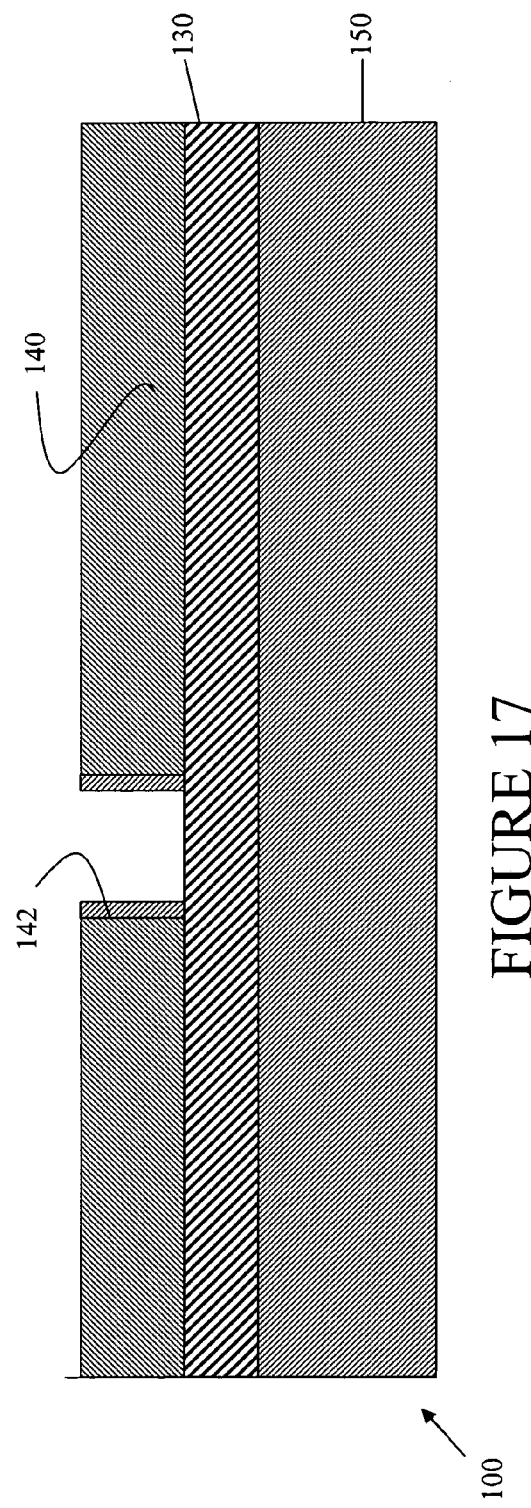
FIG. 17 is a schematic cross-sectional view representation of a portion illustrated in FIG. 16 showing a spacer material removal operation to leave spacers in an aperture.

With reference to FIGS. 16 and 17, step 227 of process 210 is discussed below. FIGS. 16 and 17 are not drawn to scale and do not include the large height associated with FIGS. 3–4. In this embodiment, step 227 forms a layer 151 of compound semiconductor material such as silicon germanium having the same ratio of germanium as layer 140. Layer 151 preferably grows on lateral side walls of trench 142 to thereby narrow the width of trench 142. Layer 151 is preferably an ultra thin layer.

Preferably, trench 142 has an original width of between approximately 5 and 100 nm. The original width can be reduced by as much as approximately 10–30 percent or more by the use of layer 151.

In FIG. 17, layer 151 is removed from a top surface of 140. Alternatively, layer 151 can remain and be removed in step 265 similar to steps 65 and 165 of processes 10 and 110. In one embodiment, layer 151 can be removed by chemical mechanical polish which removes all of layer 151 and a portion of 140. After step 227, process 210 continues similar to process 10 or process 110.

Layer 151 can be deposited by chemical vapor deposition growth, ALD or other technique as a conformal layer. The cross-sectional views of FIGS. 16 and 17 are shown in the same configuration as FIGS. 4–9.

It is understood that while the detailed drawings, specific examples, material types, thicknesses, dimensions, and particular values given provide a preferred exemplary embodiment of the present invention, the preferred exemplary embodiment is for the purpose of illustration only. The method and apparatus of the invention is not limited to the precise details and conditions disclosed. Various changes may be made to the details disclosed without departing from the scope of the invention which is defined by the following claims.

What is claimed is:

1. A method of forming a finfet including a fin-shaped channel region, the method comprising:
   providing a compound semiconductor layer above an insulating layer;
   providing a trench in the compound semiconductor layer;
   providing a strained semiconductor layer above the compound semiconductor layer and within the trench, the trench being associated with the fin-shaped channel region;
   removing the strained semiconductor layer from above the compound semiconductor layer, thereby leaving the strained semiconductor layer within the trench; and
   removing the compound semiconductor layer to leave the strained semiconductor layer and form the fin-shaped channel region.

2. The method of claim 1, further comprising providing an oxide material adjacent lateral sidewalls of the fin shaped channel region.

3. The method of claim 2, further comprising:
   providing a gate conductor over the oxide material.

4. The method of claim 1, wherein the fin-shaped channel region includes silicon (Si).

5. The method of claim 4, wherein compound semiconductor layer is a silicon germanium layer.

6. The method of claim 4, wherein the first removing step is a polishing step.

7. The method of claim 6, wherein the second removing step is an etching step selective to silicon germanium.

8. The method of claim 1, wherein the second removing step utilizes a mask, the mask protecting portions of the compound semiconductor layer for a source region and a drain region.

9. The method of claim 1, wherein the fin-shaped channel region has an aspect ratio of between approximately 4 and 6.

10. A method of FinFET channel structure formation, the method comprising:
   providing a first layer above an insulating layer above a substrate, the first layer including silicon and germanium;
   providing an aperture in the first layer, the aperture extending to the insulating layer;
   providing a strained material within the aperture; and
   removing the first layer to leave the strained material.

11. The method of claim 10, wherein the removing step is an etching step selective to silicon germanium.

12. The method of claim 10, wherein the strained material is provided by selective silicon epitaxy.

13. The method of claim 10, further comprising forming a gate dielectric structure along sidewalls and a top of the strained material.

14. The method of claim 13, wherein the strained material is provided above the first layer.

15. The method of claim 14, wherein strained material is removed from above the first layer by a chemical mechanical polish step.

16. The method of claim 15, wherein the first layer is protected by a mask during the removing step at a source location and a drain location.

17. A method of fabricating an integrated circuit including a finfet with a fin-based transistor, the method comprising steps of:
   providing a compound semiconductor layer comprising silicon and germanium above an insulative material;
   providing an aperture in the compound semiconductor layer;
   forming a strained material in the aperture by selective epitaxial growth;
   removing at least a portion of the compound semiconductor layer to thereby leave the strained material as a fin structure; and
   providing a gate structure for the fin structure.

18. The method of claim 17, wherein the aperture is between approximately 20 and 120 nm wide.

19. The method of claim 17, wherein the removing step is a dry etching step selective to silicon germanium with respect to silicon.

20. The method of claim 17, wherein the gate structure includes polysilicon.

* * * * *